(12) United States Patent
Bielinski

(10) Patent No.: US 6,401,462 B1
(45) Date of Patent: Jun. 11, 2002

(54) THERMOELECTRIC COOLING SYSTEM

(76) Inventor: George Bielinski, 1606 Carver La., Appleton, WI (US) 54904

( * ) Notice: Subject to any disclaimer, the term of this patent is extended or adjusted under 35 U.S.C. 154(b) by 0 days.

(21) Appl. No.: 09/947,787

(22) Filed: Sep. 6, 2001

Related U.S. Application Data

(63) Continuation-in-part of application No. 09/527,551, filed on Mar. 16, 2000, now Pat. No. 6,308,519.

(51) Int. Cl.[7] .............................................. F25B 21/02
(52) U.S. Cl. ............................ 62/3.7; 62/3.6; 62/457.8
(58) Field of Search ...................... 62/3.6, 3.7, 3.2, 62/457.9; 136/203, 204

(56) References Cited

U.S. PATENT DOCUMENTS

| | | | | |
|---|---|---|---|---|
| 5,609,032 A | * | 3/1997 | Bielinski | 62/3.7 |
| 5,689,957 A | * | 11/1997 | De Vilbiss et al. | 62/3.7 |
| 6,065,293 A | * | 5/2000 | Ghoshal | 62/3.2 |

* cited by examiner

*Primary Examiner*—Denise L. Esquivel
*Assistant Examiner*—Chen-Wen Jiang
(74) *Attorney, Agent, or Firm*—Robert Ryan Morishita; Anderson & Morishita

(57) ABSTRACT

A thermoelectric cooling system includes a control assembly and a direct current ("d.c.") power source providing direct current to an interface that creates a thermal flow across a thermoelectric module having at least one heat sink and at least one heat source. The d.c. power source, the interface, the control assembly, and the thermoelectric module are connected to each other in series. The control assembly optionally includes a relay and a voltage generating thermocouple. When voltage from the thermocouple reaches a predetermined threshold, the relay trips and supplies sufficient voltage to the interface to prevent thermal reversal of the heat source and heat sink. To control moisture, a metal strap may be used to restrict heat flow. Alternatively or additionally, a moisture control pad may be used to absorb and re-evaporate moisture to substantially maintain a desired humidity range. In an optional embodiment, the load to be cooled may be placed below the heat source and cooled by convection.

9 Claims, 14 Drawing Sheets

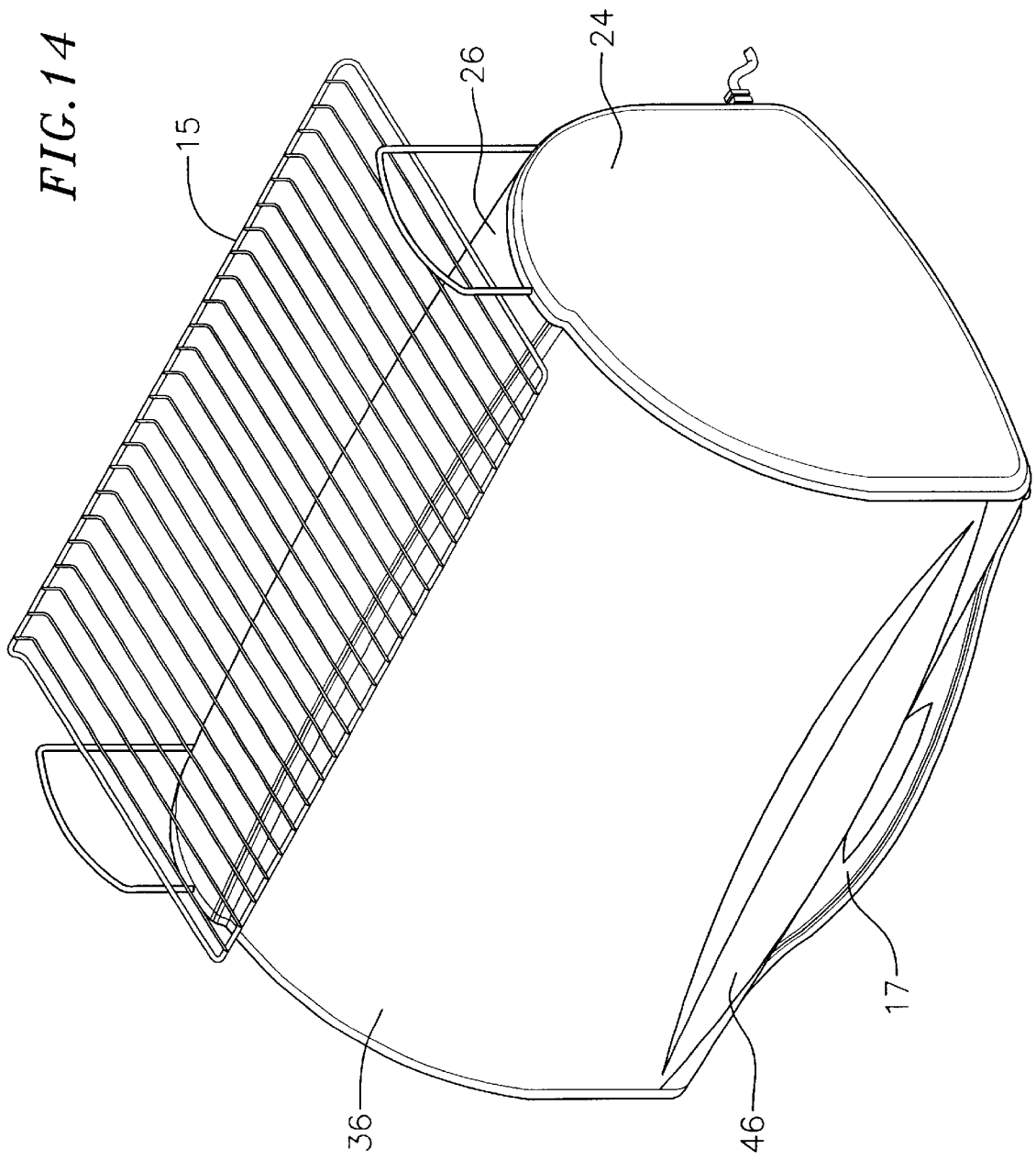

THERMOELECTRIC COOLING SYSTEM

RELATED APPLICATION DATA

The present application is a Continuation-In-Part of U.S. application Ser. No. 09/527,551, entitled "Thermoelectric Cooling System," filed Mar. 16, 2000 by Applicant herein, now U.S. Pat. No. 6,308,519.

FIELD OF THE INVENTION

The present invention relates generally to the field of thermoelectric devices and more particularly to the thermoelectric cooling system with improved performance and/or efficiency characteristics. The present invention is designed to have many applications including use in a bread box, as part of a wine rack, or in any other application requiring the cooling of a load.

BACKGROUND OF THE INVENTION

Thermoelectric cooling systems are analogous to conventional refrigeration cooling systems. For example, a conventional cooling system includes an evaporator, a compressor, and a condenser. In the evaporator or cold section, pressurized refrigerant is allowed to expand, boil, and evaporate. During the change of state from a liquid to a gas, energy in the form of heat is absorbed. In the next step, the compressor re-compresses the gas into a liquid. Further, the condenser expels the heat absorbed at the evaporate and the extra heat added by the compressor to the ambient environment.

A thermoelectric cooling system has similar subassemblies. However, thermoelectric cooling is specifically the abstraction of heat from electronic components by Peltier effect, greatly improved and made practicable with solid-state thermoelectric materials, e.g., $Bi_2Te_3$. Devices using this effect, e.g. frigistors, are used for automatic temperature control, and the like and are energized by direct current ("d.c.") thermoelectric materials, that is, any set of materials (metals) which constitute a thermoelectric system. Some examples include: "binary" systems (bismuth and tellurium), "ternary" systems (silver, antimony and tellurium), and "quaternary" systems (bismuth, tellurium, selenium and antimony, called "Neelium"). The Peltier effect is a phenomenon whereby heat is liberated or absorbed at a junction when current passes from one metal to another. In this application, a cold junction (the place where the heat source or load is located) is defined as the assembly where energy in the form of heat is absorbed when current passes from one metal to another. A hot junction (the place where the heat sink is located) is the assembly which thermally communicates with a heat exchanger and through which the heat that is liberated, when current passes from one metal to another, is transferred to the ambient environment.

Major differences exist between thermoelectric cooling systems and conventional refrigeration systems, however. For example, conventional refrigeration systems must maintain a closed environment isolated from the ambient. Further, conventional refrigeration systems have a large amount of insulation and cannot be ventilated without loss of cooling effect. Thus, conventional cooling systems may contain odors of the loads placed within and such odors may be transferred to other loads placed within the cooling system, with obviously undesirable results. Further, conventional cooling systems may adversely affect the physical characteristics of the product being cooled, such as texture, taste, shelf life, and the like, of certain food articles which may be placed therein. For example, fresh baked bread may, if humidity and temperature are not carefully controlled, become soggy on at least one side during the cooling process.

Thermoelectric cooling systems, by contrast, provide a measure of advantage to the several shortcomings noted above. However, thermoelectric cooling systems of the prior art lack efficiency in certain respects because, upon interruption of the power supply, the current reverses flow such that what was a heat source becomes the heat sink, and what was the heat sink now becomes the heat source. Additionally, thermoelectric cooling systems of the prior art tend to suffer from moisture condensation problems near the thermoelectric chip or the cooling plate.

SUMMARY OF THE INVENTION

The invention may be generally described as a thermoelectric cooling system having an electric circuit comprising a direct current ("d.c.") power source for providing direct current throughout the electric circuit, a thermoelectric module having at least one heat sink and at least one heat source capable of being cooled to a predetermined temperature range, and a control assembly. The d.c. power source, the control assembly, and the thermoelectric module are connected to each other in series. In one optional embodiment, the control assembly comprises a thermostat control switch mechanism and a resistive element connected to each other in parallel. In such an embodiment, the thermostat control switch mechanism has a sensor coupled to or thermally associated with the heat source of the thermoelectric module so that the temperature of the heat source can be monitored. The thermostat control switch mechanism is normally open in the predetermined temperature range detected by the sensor. The resistive element having a predetermined resistance sufficient for a level of voltage to be provided to the thermoelectric module, when the thermostat control switch mechanism is open, sufficient to substantially prevent reversal of the heat source and the heat sink.

In an alternate embodiment, the control assembly comprises a relay with a voltage generating thermocouple. In this embodiment, the relay senses the voltage from the thermocouple. Upon sensing a predetermined threshold level, the relay is energized and provides a level of voltage to the interface sufficient to substantially prevent reversal of the heat source and the heat sink.

More particularly, the circuit of the present invention may be used in a thermoelectric bread box or a thermoelectric wine bottle cooling rack. The thermoelectric bread box maintains freshness by keeping wrapped bread at a specified temperature range to prevent spoilage by mold growth. The device is almost devoid of insulation except to prevent condensation inside the thermoelectric element. The conforming cooling plate that is placed around the load is a substantially U-shaped absorber to remove the heat. From test data it appears that when a conforming cooling plate is used objects cool faster. When conformal cooling plates or heat absorbers are employed on a bottle or container of liquid, e.g., wine, stratification is prevented and circulation is promoted inside the bottle which aids cooling. An explanation for this effect on liquids or wrapped bread may be that long wave radiation frequencies of 2 microns or greater, coming from wrapped bread, glass bottles, or other containers are absorbed by a conformal aluminum or copper plate (or plate having similar characteristics) if it surrounds a substantial portion, at least 75%, of the object to be cooled. An alternative explanation may be that substantially all the surface area of the body being cooled is associated with the conformal cooling surface. This method cools a bottle of water faster than a refrigerator using circulated cold air. This can be accomplished without insulating the entire box.

Alternatively, it has recently been found that effective cooling of liquids, like wine, in containers, like bottles, may be accomplished with a conformal cooling plate (first body) in cooling association with less than 75% of the object to be cooled, provided, a portion of the conformal cooling plate is in cooling contact or association with at least a portion of one side of the container or object to be cooled (the load). Liquids cooled by such a structure, or such a process, avoid stratification and substantially unequal cooling. Accordingly, uniform cooling of a liquid and maintenance of such uniform cooling may be accomplished by use of this alternative structure and method.

The thermoelectric cooling system of the present invention may likewise be described as a first body which is the heat source, a second body which is the heat sink, and an interface composed of thermoelectric materials thermally connecting or coupling the first body with the second body. The interface is connected in a series to a d.c. power source. The first body is operable to absorb heat and thereafter transfer the heat to the second body through the interface, by the Peltier effect, when current is applied to the interface from the d.c. power source. The thermoelectric cooling system further includes a control assembly. As discussed above, in a first embodiment, the control assembly is a thermostat and a resistor which are electrically connected in parallel to one another. The parallel connection of the thermostat and the resistor creates a control device which allows the flow of current in a direction which prevents movement of heat from the second body to the first body when the thermostat control switch is opened. A minimum voltage is retained in the circuit and the heat return to the first body is thereby minimized. In a second alternate embodiment, the control assembly is a relay and a thermocouple. The thermocouple applies a voltage to trip the relay which raises the level of voltage to the interface sufficient to substantially prevent reversal of the heat source and the heat sink.

The first body includes a shelf or conforming plate mounted within a housing, and wherein the load or article of interest (typically articles of food or beverage containers) to be cooled is placed on the shelf or within the conforming plate. The shelf or conforming plate are preferably made of a highly heat conductive material like metal and may have a uniform thickness or optionally, varying thickness. Alternatively, the load may rest on an isolated surface below a shelf. The load is then cooled by convection rather than conduction. The second body, made of a heat conductive material, includes a radiator, preferably having a plurality of fins which radiate heat therefrom. The design of the first body and the second body is such that a steady state device is created, that is, the radiator emanates an amount of heat which is substantially equivalent to the heat generated by the mass of the shelf and the load on the shelf and the heat produced by the electrical circuit. The invention may further include a fan directing heated air from the second body to an enclosed area to create an area of higher temperature.

The interface comprises a semiconductor or plurality of semiconductors which produce the desired Peltier effect. Varying numbers and types of semiconductors or other suitable thermoelectric materials may be employed to achieve different degrees of cooling.

The housing may include several apertures which serve to ventilate the load placed upon the shelf and cooled by the effects of conduction. The present invention requires little, if any, insulation. The housing may also include an external rack.

As a means of moisture control, various elements may be placed in thermal association with the first body, the interface, or both. In one embodiment of the present invention, a metal strap is disposed intermediate the interface and the first body such that the first body, metal strap, and interface are mechanically connected in series. The area over which the strap and first body contact is much smaller than the total surface area of the first body thereby restricting the amount of heat transferred from the first body to the interface. In this fashion, the first body may be maintained above the dew point of the surrounding air.

In an alternate embodiment, a moisture control pad is disposed in thermal association with the first body, the interface, or both. For example, in an optional embodiment, a moisture control pad is disposed intermediate the interface and the first body. Similarly, in an optional embodiment, the moisture control pad may be disposed on the surface of the first body facing toward the load. The moisture control pad is formed from a material that absorbs moisture and permits re-evaporation of the absorbed moisture to substantially maintain a desired humidity range. Suitable materials for the moisture control pad include pulp fiber paper.

BRIEF DESCRIPTION OF THE DRAWINGS

FIG. 14 is an elevated front view of a thermoelectric cooling system according to an alternate embodiment of the present invention with a rack in a raised position.

DESCRIPTION

Figure 1:
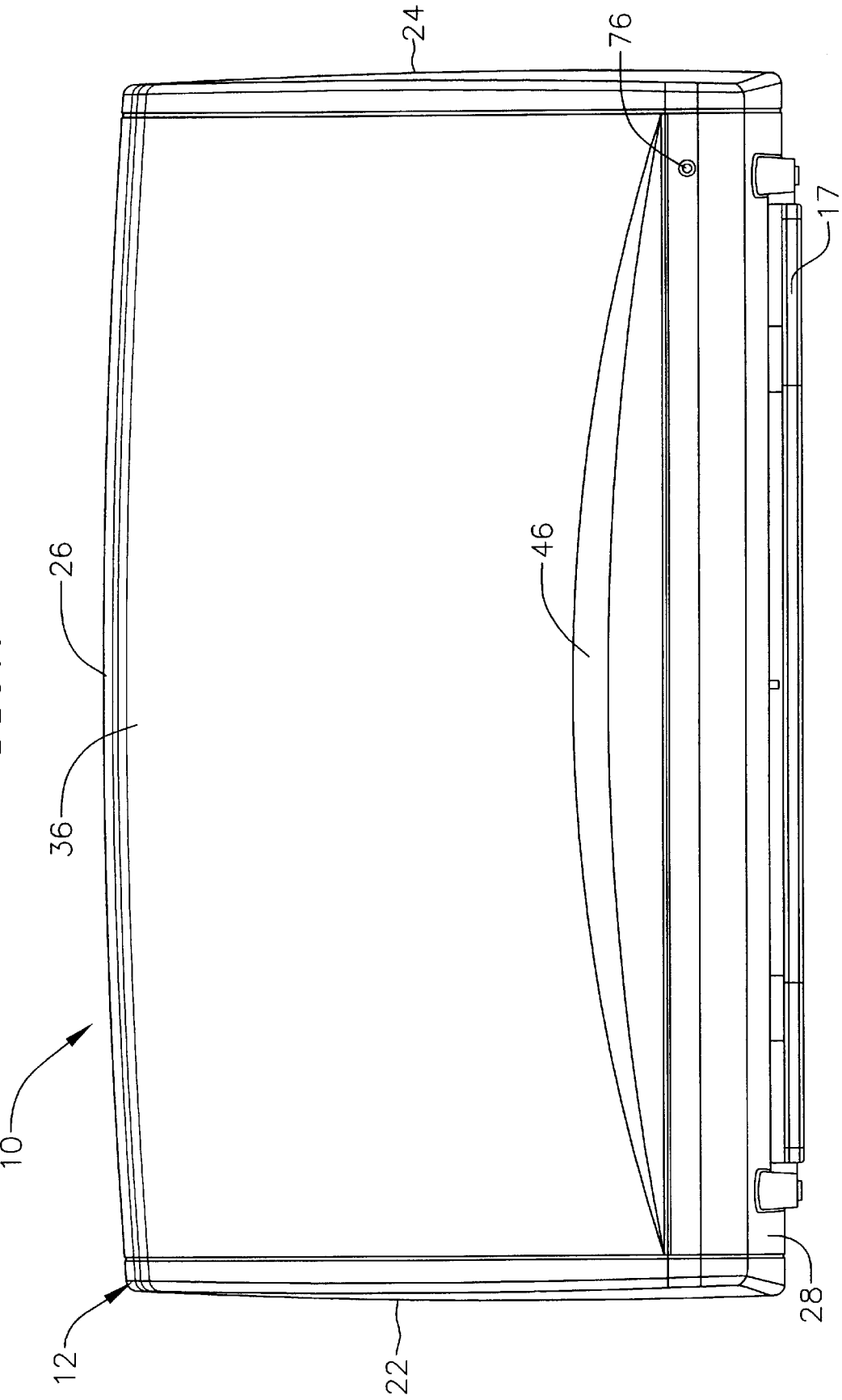
FIG. 1 is a front view of a thermoelectric cooling system according to an embodiment of the present invention with the door closed.
Figure 2:
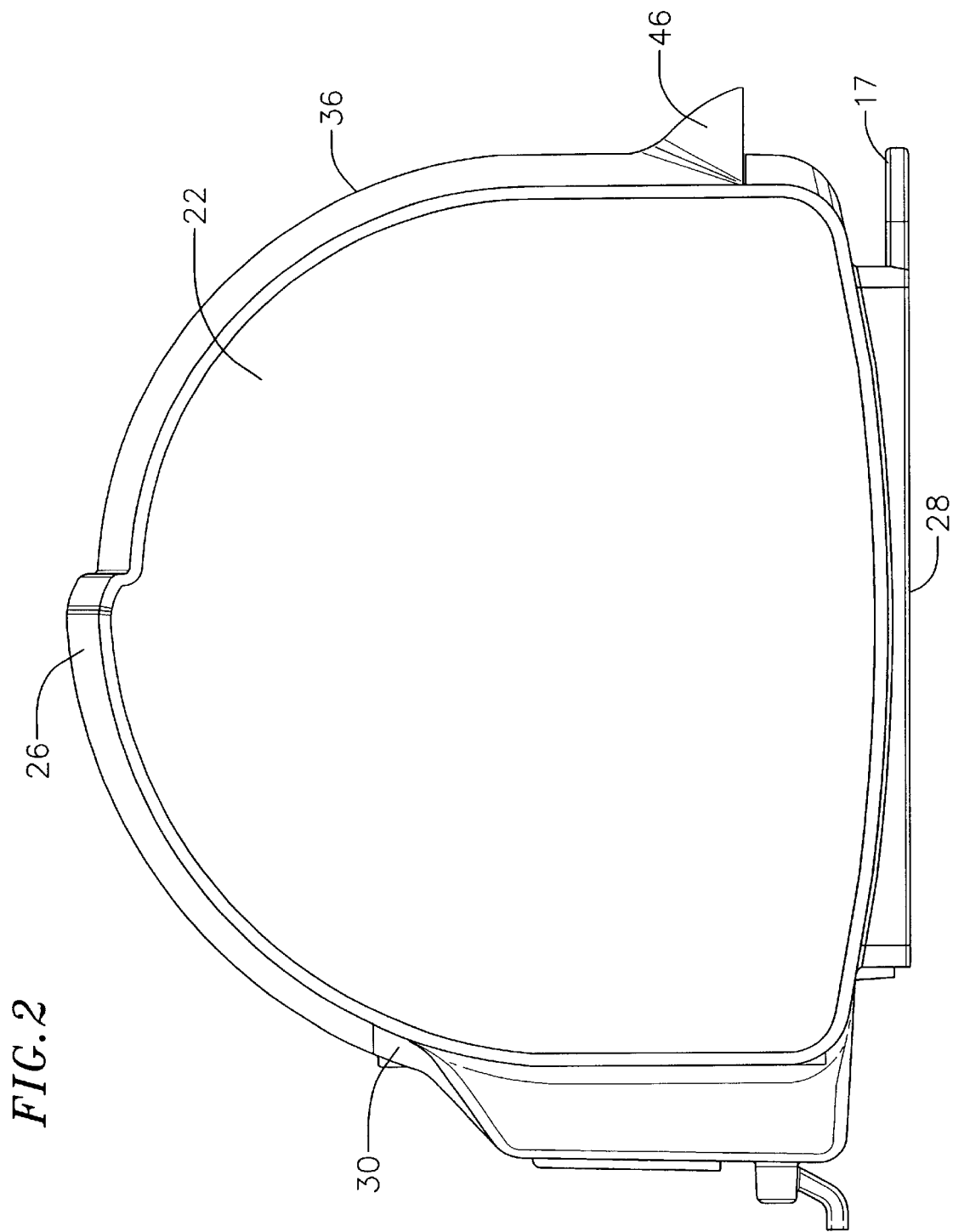
FIG. 2 is a left side view of a thermoelectric cooling system according to an embodiment of the present invention with the door closed.
Figure 3:
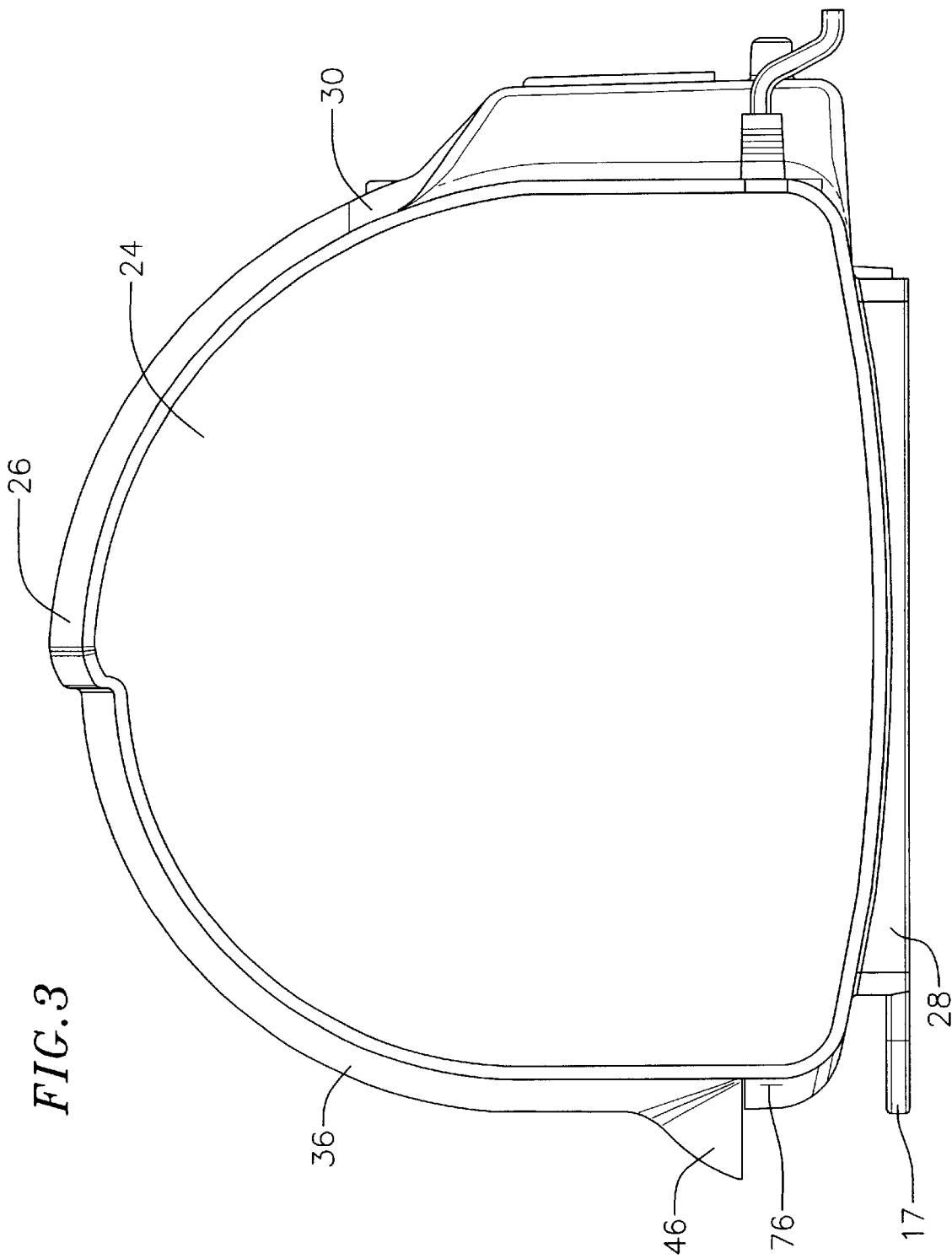
FIG. 3 is a right side view of a thermoelectric cooling system according to an embodiment of the present invention.
Figure 4:
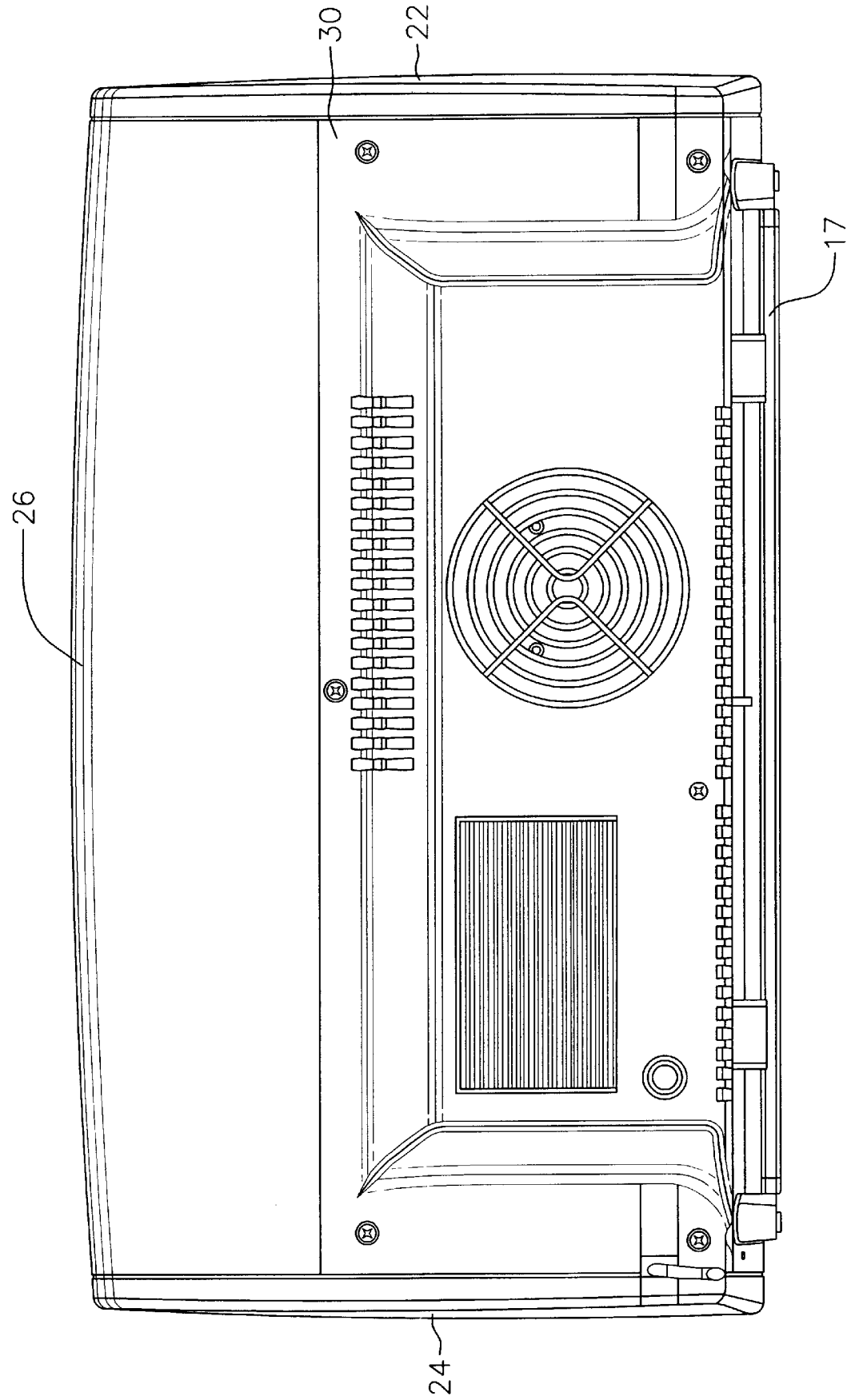
FIG. 4 is a rear view of a thermoelectric cooling system according to an embodiment of the present invention.
Figure 5:
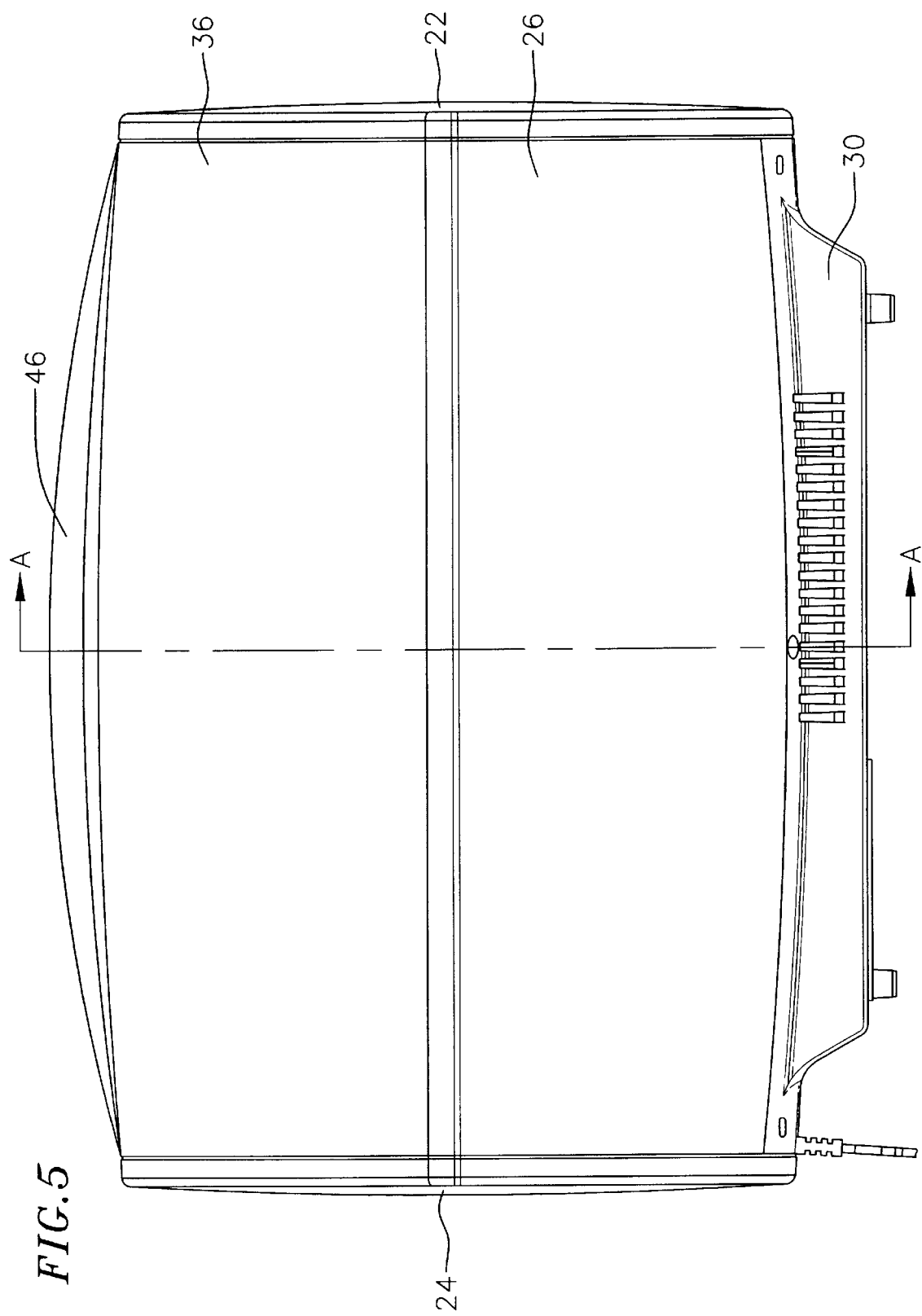
FIG. 5 is a top view of a thermoelectric cooling system according to an embodiment of the present invention.

Reference is now made to the figures wherein like parts are referred to by like numerals throughout. With reference to FIGS. 1–6, a thermoelectric cooling system 10 according to the present invention generally includes a housing 12, a first body 14, a second body 16, an interface 18, and a thermostatic control unit 70.

The housing 12 could take many different forms, but the embodiment of FIGS. 1–5 is generally box-shaped to accommodate its purpose as an electrically cooled bread box. The housing 12 includes a left side wall 22, a right side wall 24 opposing the left side wall 22, a top wall 26, a bottom wall 28 opposing the top wall 26, and a back wall 30. The left side wall 22, the right side wall 24, the top wall 26 and the bottom wall 28 each terminate in an edge 32 which opposes the back wall 30, and which defines an opening 34. The walls 22, 24, 26, 28, and 30, and a door 36 cooperate to define an interior compartment or cavity 40. The individual walls 22, 24, 26, 28, and 30 are optionally made from a thermally conductive material.

Figure 6:
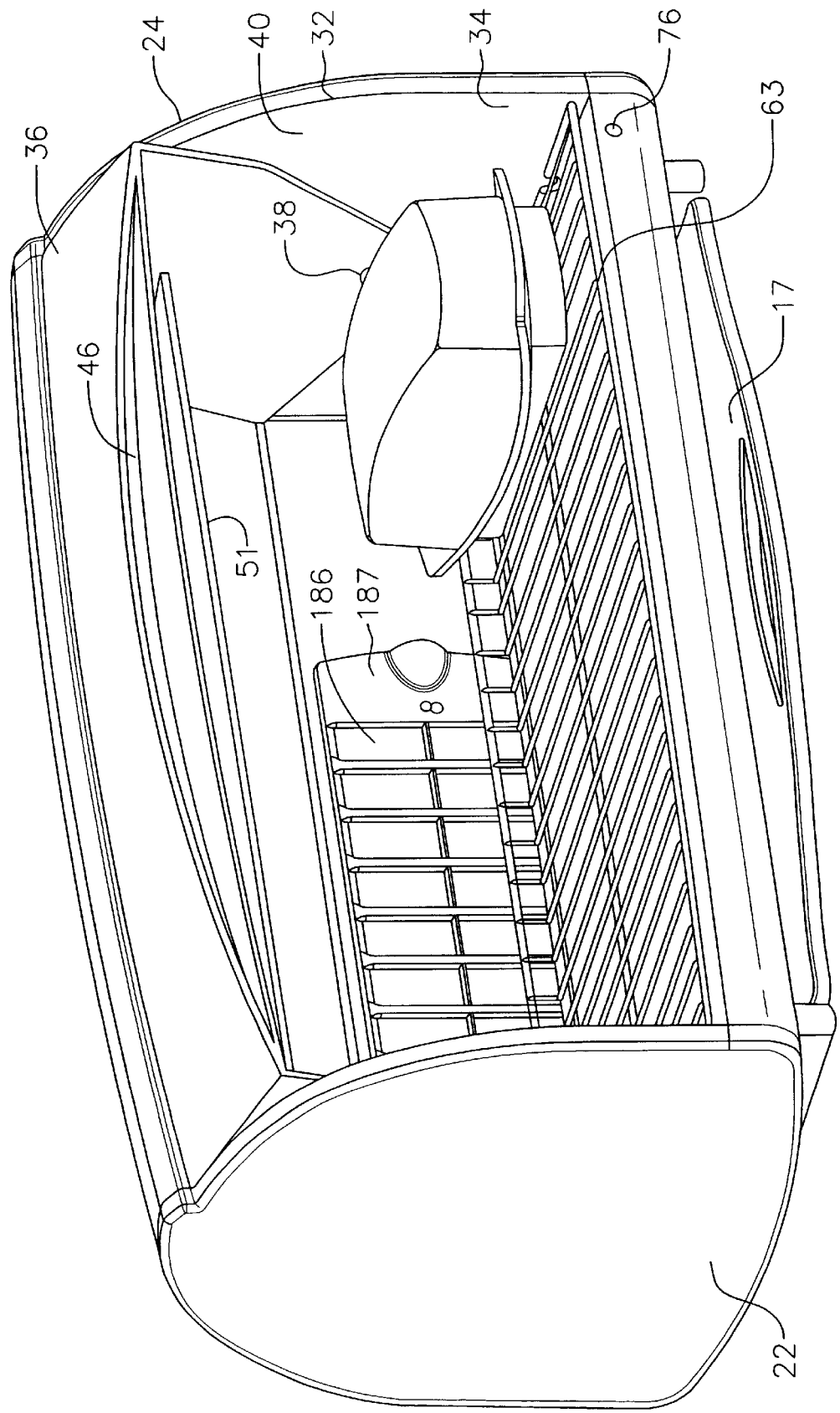
FIG. 6 is an elevated front view of a thermoelectric cooling system according to an embodiment of the present invention with the door open.
Figure 12:
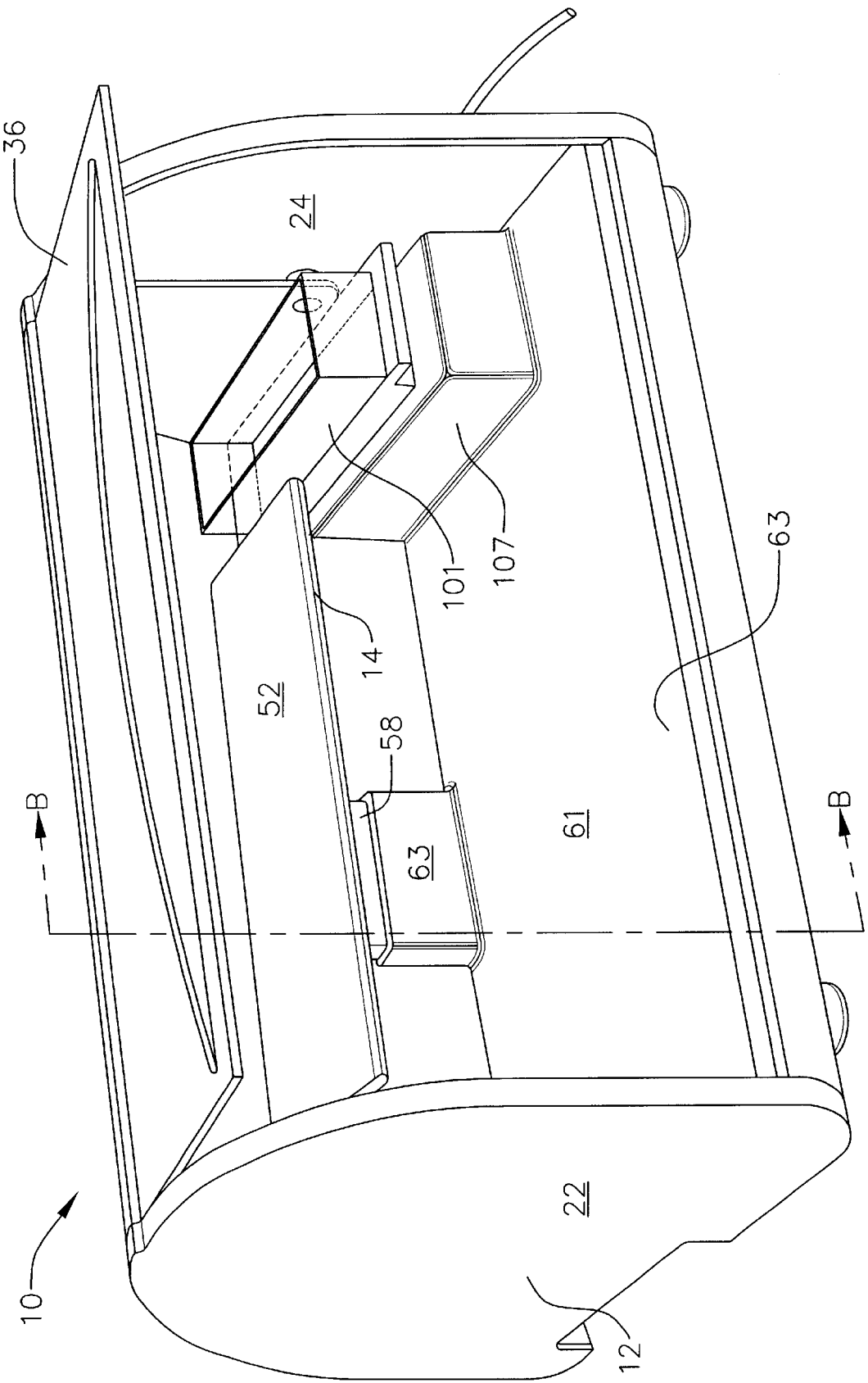
FIG. 12 is an elevated front view of a thermoelectric cooling system according to an alternate embodiment of the present invention with the door open.

A door 36 is attached by hinges 38 to the housing 12. The door 36 pivots on the hinges 38 to open, as shown in FIGS. 6 and 12, and close, as shown in FIGS. 1–5, 13, and 14, the opening 34. The door 36 has an inwardly-facing surface 42 which faces the interior compartment 40 when the door 36 is closed, and an outwardly facing surface 44. The door 36 further includes a handle 46. Optionally, the door 36 may include a latch to retain the door 36 closed. For example, the handle 46 may extend through the door 36 and attach to a latch such that rotation of the handle 46 simultaneously rotates the latch.

In an optional embodiment, the housing 12 may further include apertures (not shown) which are located in the left side wall 22 and the right side wall 24. The apertures (not shown) serve to ventilate the loads which are placed within the housing 12 to be cooled. Alternatively, other moisture control systems could be used as will be described hereinafter.

The housing 12 as depicted herein is sized to permit the cooling of a food product such as a loaf of bread. The housing 12 is optionally fashioned to have an appearance such that it is an attractive addition to a counter top or other area of a kitchen. The exterior of the housing 12 is optionally painted with reflective white paint that prevents normal radiation from entering into the interior compartment 40. The housing 12 may additionally include an external rack 15 for retaining objects. The rack 15 may optionally be pivotable, or otherwise movable, between a storage position and a raised position, as shown in FIG. 14. The exterior of the housing 12 may additionally include a cutting board 17 mounted to slide from the housing 12.

Referring again to FIGS. 1–14, the first body 14 is a heat source of the thermoelectric cooling system 10, the second body 16 is a heat sink for the thermoelectric cooling system 10, and the interface 18 creates a temperature gradient to draw heat from the first body 14 to the second body 16. The first body 14 may take a variety of forms, but in the embodiment of FIGS. 6–8 the first body 14 includes a conformal plate 51 mounted inside the housing 12. Alternatively, as shown in FIGS. 12 and 13, the first body 14 includes a shelf 52 mounted within the interior compartment 40 of the housing 12.

Figure 7:
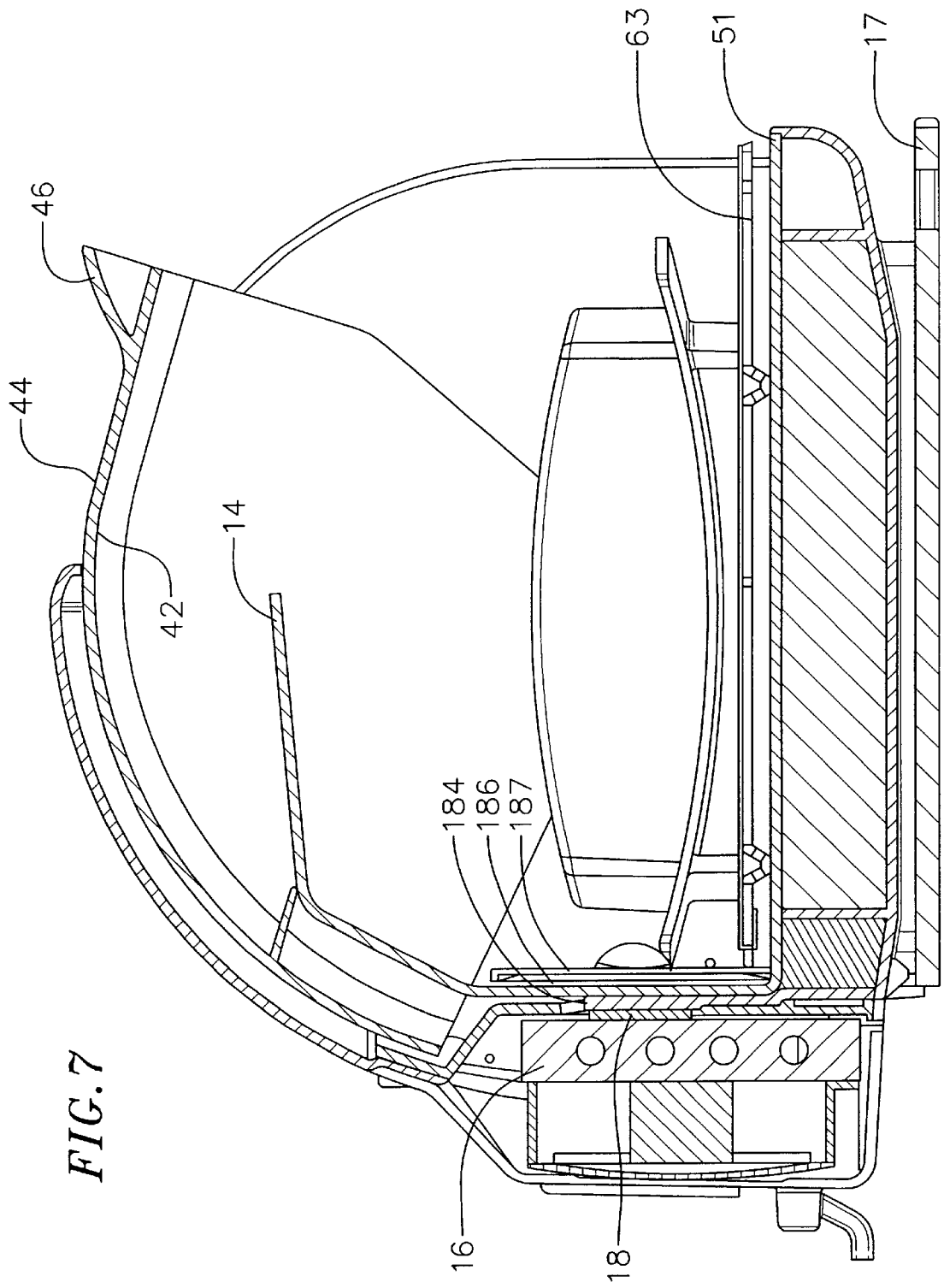
FIG. 7 is a cutaway side view of a thermoelectric cooling system according to an embodiment of the present invention with the door open taken along section line A—A of FIG. 5.
Figure 8:
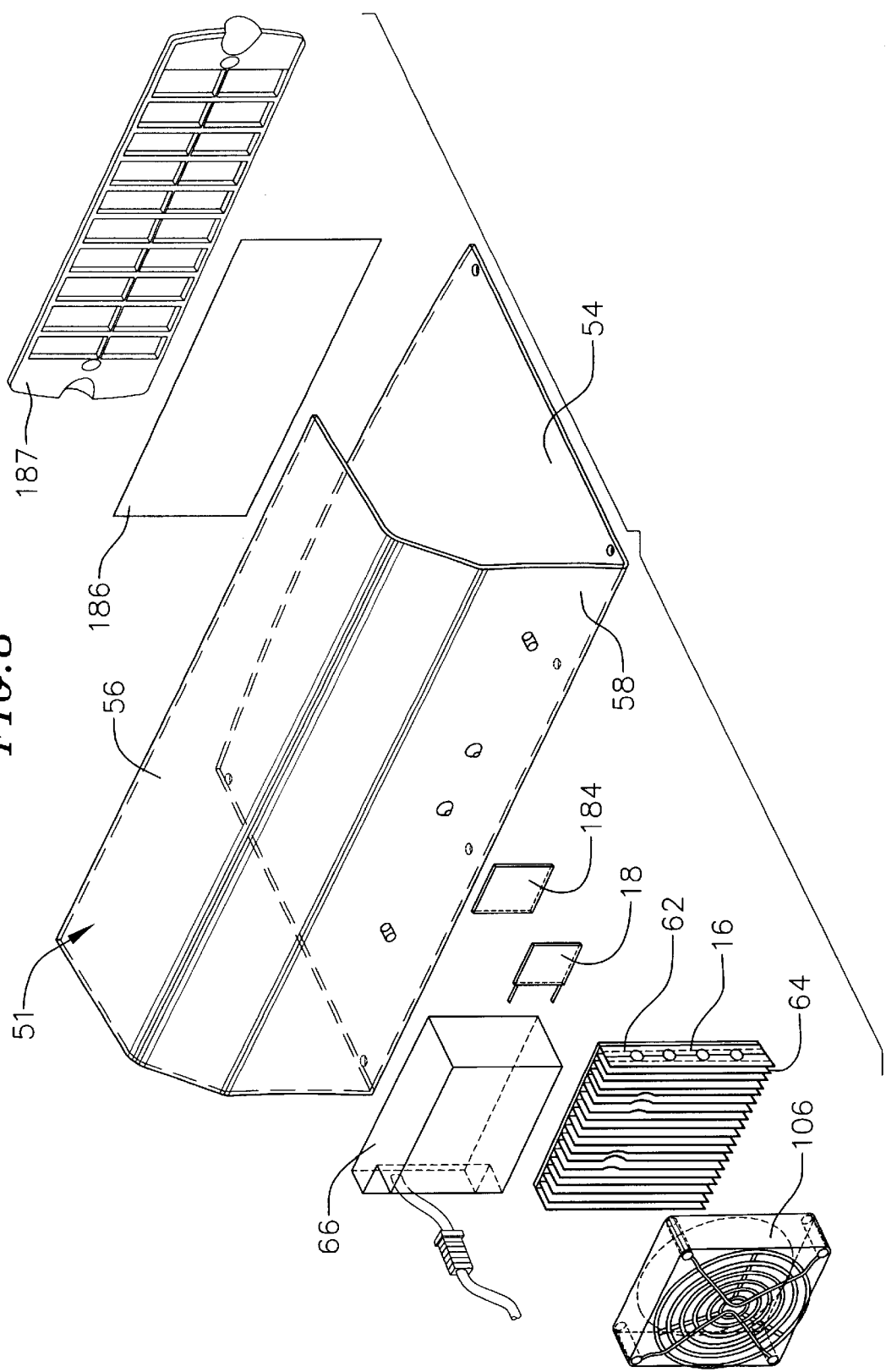
FIG. 8 is an assembly view of a first body, interface, second body, and moisture control pad of a thermoelectric cooling system according to an embodiment of the present invention.
Figure 13:
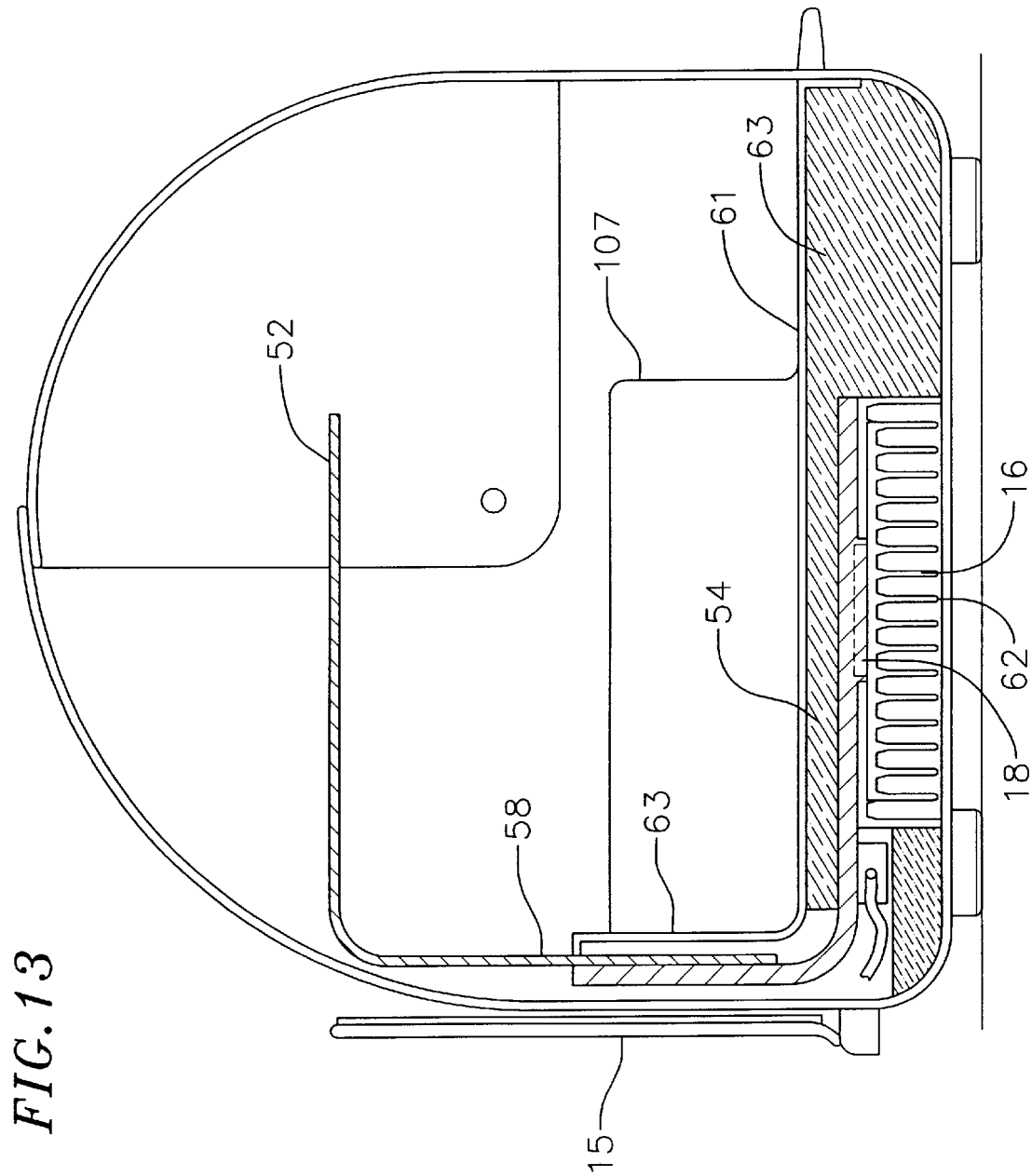
FIG. 13 is a cutaway side view of a thermoelectric cooling system according to an embodiment of the present invention with the door closed taken along section line B—B of FIG. 12.

The conformal plate 51 or shelf 52 extends between the left side wall 22 and the right side wall 24, and, as viewed in the cross-sectional view of FIGS. 7 and 13 and the assembly view of FIG. 8, is generally U-shaped in configuration when viewed from either the right or the left side. The U-shape of the conformal plate 51 or shelf 52 includes a first leg 54, a second leg 56, which is substantially parallel to the first leg 54, and a third leg 58 which extends there between and is perpendicular to the first and second legs 52 and 54, respectively. The first leg 54 of the shelf 52 is positioned against the bottom wall 28 and the third leg 58 is positioned against the back wall 30. A layer of thermal insulation, made from polyethylene or a similar material, may optionally be placed between the legs 54 and 58 and the walls 28 and 30, respectively. The thermal insulation is optionally used to thermally insulate the conformal plate 51 or shelf 52 thereby optimizing its cooling efficiency. While the conformal plate 51 or shelf 52 could be made from a variety of substrates or combinations of substrates, the conformal plate 51 or shelf 52 is optionally made of a heat conductive material to remove heat from the loads placed thereon.

As shown in FIGS. 12 and 13, in an optional embodiment utilizing a shelf 52, the size of the housing 12 and the shelf 52 is such that there is sufficient clearance between the second leg 56 and the top wall 26, or between the first leg 54 and the second leg 56 to place the loads on top either the first leg 54 or the second leg 56. In a first aspect of the present invention, the load is cooled through the shelf 52 by the effects of conduction and absorption of heat at the Peltier junction.

Additionally, the thickness of the shelf 52 may optionally vary to create temperature gradients throughout the shelf 52. This allows loads to be held at different temperatures depending on the location of the load on the shelf. For example, as shown in FIG. 13, the shelf may comprise two connected plates—a thinner second leg 56 connected to a thicker first leg 54 through a joint at the third leg 58. In such an embodiment, the second leg 56 optionally may be maintained at 55° F. and may be connected to the supporting third leg 58 maintained at 50° F. that, in turn, connects to a first leg 54, the surface of which may be maintained at 49° F.

Figure 11:
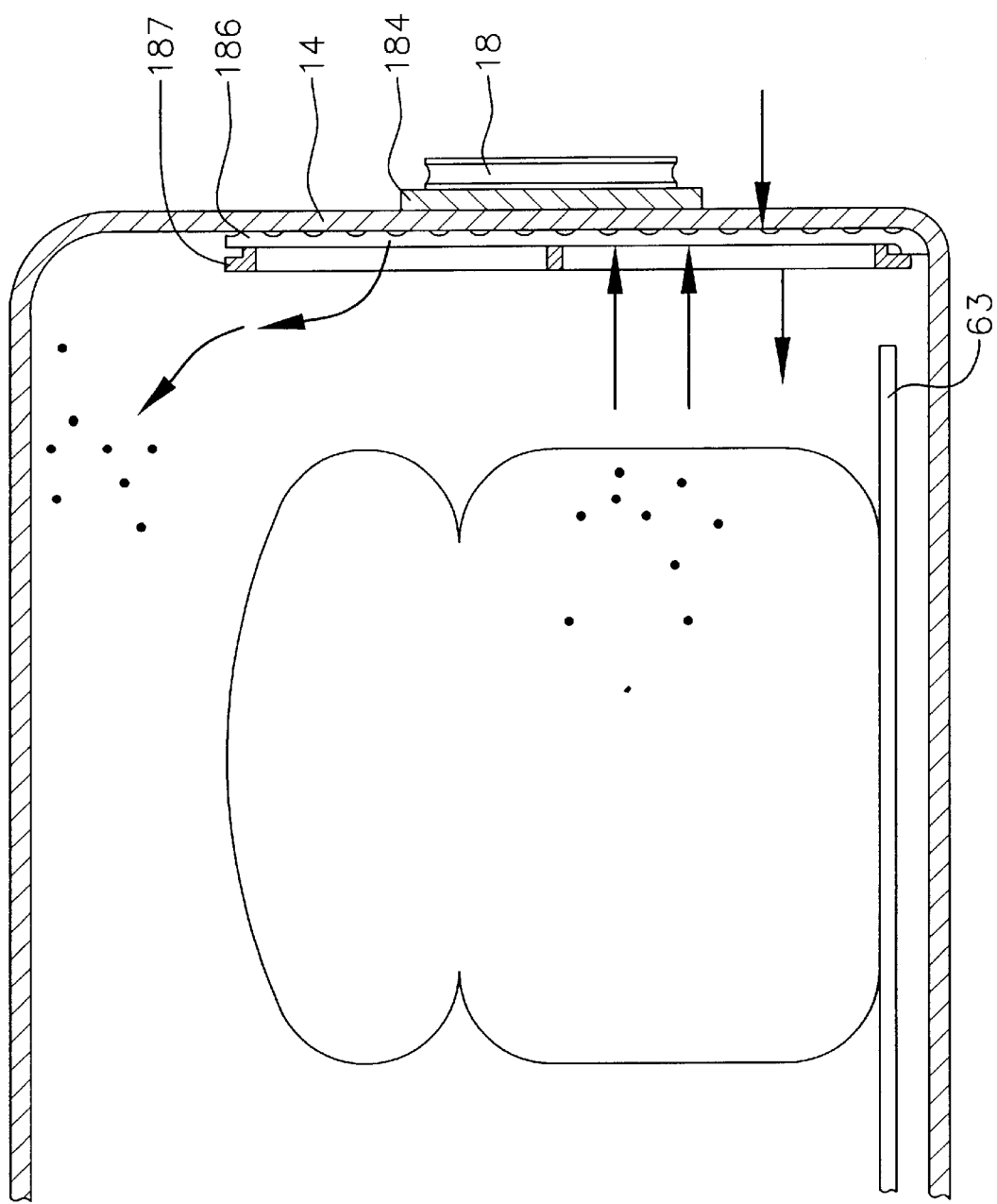
FIG. 11 is an enlarged side view of a moisture control system according to an embodiment of the present invention.

In an optional alternate aspect of the present invention, shown in FIGS. 6–8 and 11, loads are cooled through a conformal plate 51 by the effects of convection. In such an embodiment, an internal floor 61 rests above the conformal plate 51 of the first body 14. Thus, the load is isolated from direct contact with the surface of the conformal plate 51. By resting on an internal floor 61 rather than the conformal plate 51, condensation is less likely to form on the load. The internal floor could take the form of an insulated floor platform 61 as shown in FIGS. 12 and 13 or an elevated rack 63 positioned above the insulated or uninsulated first leg 54 as shown in FIGS. 6, 7, and 11. Again, by isolating the load from direct contact with the shelf 52 condensation is less likely to form on the surface of the load. In either optional embodiment, the air surrounding the load is maintained at a set temperature by cooled air drawn by gravity down to the load from the second leg 56. Thus, rather than cooling the load by direct conduction, the load is cooled by convection. That is, the first body 14 cools the air surrounding the load rather than directly cooling the load.

With reference to FIGS. 7–11 and 13, the interface 18 is located intermediate the first body 14 and the second body 16. The interface 18 includes a semiconductor module utilizing the Peltier effect to create a temperature gradient. The Peltier effect occurs when electric current passes from one material to another. Some examples of interfaces 18 include: "binary" systems (bismuth and tellurium), "ternary" systems (silver, antimony and tellurium), and "quaternary" systems (bismuth, tellurium, selenium and antimony, called "Neelium"). Such modules are available in a variety of sizes, shapes, operating currents, operating voltages, and ranges of heat pumping capacity. The specific module selected depends upon the cooling specifications of the thermoelectric cooling system 10. The semiconductor modules known in the prior are encased within a layer of ceramic coating to keep out moisture and electrically insulate the module from the first 14 and second 16 bodies.

The second body 16 acts as a heat sink. The second body 16 includes a radiator 62 having a plurality of fins 64 which are shown in FIGS. 8 and 13 for providing increased surface area for disposal of heat. The radiator 62 has a black anodized coating to optimize radiation of heat therefrom. The first body 14 and the second body 16 are coupled to the interface 18 so that a heat flow is created by the interface to transfer heat energy from the first body 14 to the second body 16. Optionally, the design of the first body 14, and the second body 16 is such that a steady state device is created, that is, the radiator 62 substantially emanates the quantity of heat generated by the mass of the conformal plate 51 or shelf 52 and the heat generated by the electrical circuit. The heat balance described herein may be established by a calculation of heat transfer according to known methods, or by a trial-and-error process.

Figure 9:
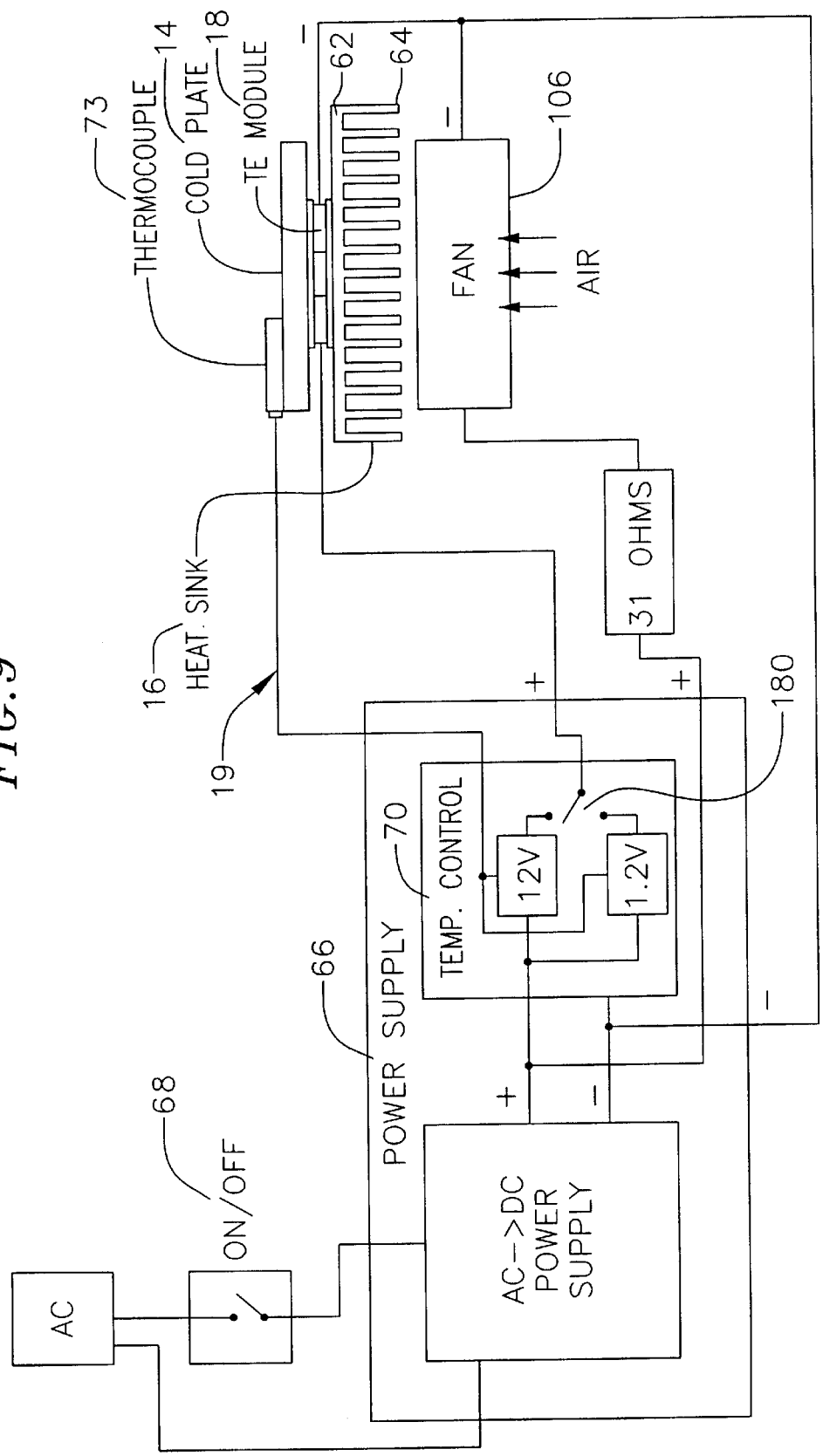
FIG. 9 is a schematic diagram of an electrical circuit for a thermoelectric cooling system according to an embodiment of the present invention.
Figure 10:
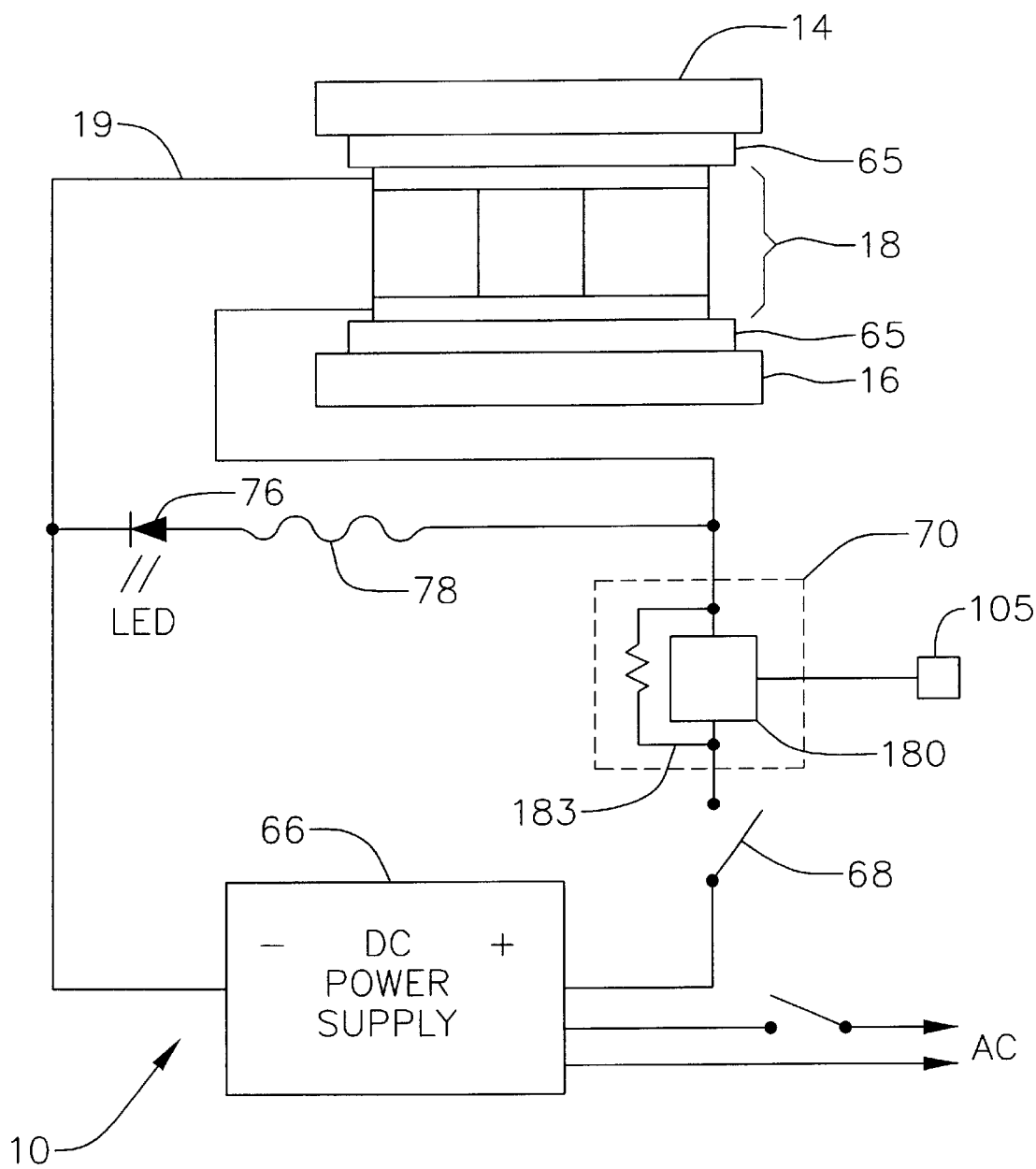
FIG. 10 is a schematic diagram of an electrical circuit for a thermoelectric cooling system according to an alternate embodiment of the present invention.

FIGS. 9 and 10 show possible embodiments of the circuitry employed in the present invention. The electrical circuit 19 of the thermoelectric cooling system 10 includes a direct current ("d.c.") power source 66, a switch 68, and a thermostatic control unit 70. The switch 68 is simply a manual switch by which the user may turn the thermoelectric cooling system 10 on or off. In the optional embodiment of FIG. 9, the thermostatic control unit 70 comprises a relay 180 is coupled to a thermocouple 73 sensing the temperature of the first body 14. The thermocouple 73 generates voltage proportional to the temperature sensed. As the temperature of the first body increases, the voltage generated by the thermocouple 73 also increases. The increased voltage causes the relay 180 to trip and supply a first, higher voltage to the interface 18 thereby increasing the temperature gradient from the first body 14 to the second body 16 to cool the first body 14. As the temperature of the first body 14 decreases, the thermocouple 73 voltage decreases, thereby tripping the relay 180 and causing a second, lower voltage to be supplied to the interface 18. The lower voltage causes a decrease in the temperature gradient from the first body 14 to the second body 16 but is sufficient to prevent reversal of heat from the second body 16 to the first body 14.

For example, FIG. 10 shows an embodiment of the circuitry employed in the present invention. As above, the electrical circuit 19 of the thermoelectric cooling system 10 includes a direct current ("d.c.") power source 66, a switch 68, and a thermostatic control unit 70. However, in this optional embodiment, the thermostatic control unit 70 comprises a voltage sensitive relay 180 that includes a voltage sensor. The voltage sensitive relay 180 is closed by the voltage generating thermocouple 73 when the temperature rises thereby supplying the interface 18 with a predetermined upper voltage and cooling the load. When the thermocouple 73 cools, the relay is opened and the interface 18 is supplied with a predetermined lower voltage. Optionally, a resistor 183 in parallel with the relay maintains the circuit at the lower voltage thereby preventing heat from transferring from the second body back to the first body.

So long as the optimum voltage (typically 1.2 volts) is supplied to the interface 18 through the control assembly 70 to overcome the reversal voltage, the heat source and heat sink will not reverse and the temperature of the load or article of interest will be maintained in the desired temperature range. The optimum voltage prevents reversal of the heat flow from the heat source to the heat sink, i.e. from the first 14 body to the second body 16, so that the cold side stays cold since the 1.2 volt of electricity allowed to run through the circuit 19 is sufficient to overcome the roughly 1.2 volt of reversal voltage of the circuit 19 in the optional embodiment of FIG. 10.

The electrical circuit 19 of FIG. 10 further shows an optional light emitting diode ("LED") 76 and resistor 78 that are electrically connected to each other and disposed to the opposite polarity of the power source. The purpose of the LED 76 is to indicate to the user whether the thermoelectric cooling system 10 has been turned on or off by the switch 68. The resistor 78 reduces the voltage through the LED to a voltage level with which it is compatible.

The specifications of the housing 12, the shelf 52, and the electrical circuit 19 may be altered in order to be adapted to different specific uses. For example, one particularly desirable use would be to apply the thermoelectric cooling system 10 as a cooled bread box, as shown in the figures. In such an application, the housing 12 and the conformal plate 51 or shelf 52 are sized to accommodate a loaf of bread. The thermoelectric cooling system 10 is particularly well suited to bakery products because the system 10 does not accumulate and transfer odors as would occur with a conventional refrigerator having an evaporator, a compressor, and a condenser. The thermoelectric system 10 further does not produce an environment which reduces humidity, which is further beneficial to an extended shelf life for bakery products. The power draw of the thermoelectric cooling system 10 as applied to cooling of a loaf of bread to around a range of 52°–62° F. is about 40 watts.

It is to be understood that the thermoelectric cooling system 10 as described above and specifically applied to a use as a bread box may be used for many other products, for example, bakery products and medicines which require refrigeration. It is to be further understood that the specification of the thermoelectric cooling system 10 may be altered for other contemplated uses which may require alternate physical dimensions or degrees of cooling. Additional cooling may be accomplished, for example, by incorporating additional semiconductors into the electrical circuit to increase the amounts of cooling.

As discussed above, many applications, such as bread boxes, humidors, and the like, may include means for controlling the moisture in the housing 12. For example, the electric circuit may additionally include an ambient temperature sensor 105 to measure the ambient temperature and vary the thermostat settings as the ambient temperature varies within a range, for example from 55° F. to 90° F. Based on ambient temperature and, optionally, the humidity, the internal temperature could be adjusted to prevent the internal temperature from dropping below the dew point of the air. In other words, as ambient temperature rises, the internal temperature can be raised to prevent condensation from forming on the load to be cooled such as a loaf of bread.

Referring to FIGS. 7 and 8, as an alternate or additional method of controlling moisture inside the housing 12, a thermal body, such as a metal strap 184, is disposed intermediate the interface 18 and the first body 14 such that the first body 14, metal strap 184, and interface 18 are mechanically connected in parallel. In such an embodiment, the metal strap 184 has a contact surface substantially smaller than the surface area of the first body 14. Thus, the heat transferred from the first body 14 to the interface 18 is restricted by the small transfer area of the metal strap 184 thereby preventing condensation by maintaining the first body 14 at a temperature greater than the dew point of the air inside the housing.

In an alternate embodiment, a moisture control pad 186 may be disposed in thermal association with the first body 14, the interface 18, or both. For example, in the embodiment shown in FIGS. 7 and 8, the moisture control pad 186 is held against the first body 14 using a grid cover 187. The moisture control pad 186 is formed from a material that absorbs moisture from the air inside the housing 12 when the humidity exceeds a certain level and re-evaporate the absorbed moisture when the humidity drops below another certain level as shown in FIG. 11. In an optional embodiment utilizing a U-shaped first body 14, the moisture control pad 186 may additionally contact the first leg 54 at the bottom of the first body 14 to wick any condensate collecting at the bottom of the first body 14 for re-evaporation into the housing 12. For example, in an optional embodiment using pulp fiber paper, it is possible to maintain the humidity inside the housing between sixty and eighty-four percent relative humidity. In such an optional embodiment, a moisture control pad 186 with a surface area of forty square inches is utilized in a housing with a volume of one and one-half cubic feet. In another optional embodiment, a moisture control pad 186 may be additionally or alternatively exposed to ambient air to absorb moisture from the ambient air and re-evaporate the stored moisture into the housing 12.

The electric circuit of the thermoelectric cooling system 10 could be further modified as shown in FIG. 9 to include a quick cooling fan 106 or to further include a vent fan (not shown) actuated by a humidistat (not shown). The humidistat (not shown) could be set to a desired humidity range and actuate the vent fan (not shown), so that when the desired humidity range is exceeded the air containing the excessive moisture is quickly expelled.

Additionally, referring to FIG. 9, a cooling fan 106 could be added to either the beverage cooler and the bread box of the thermoelectric cooling system 10 to provide for a quick chill feature. The cooling fan 106 would be directed at the heat sink or second body 16. The cooling fan 106 is connected in parallel to the interface 18. Actuation of the cooling fan 106 increases the rate of heat dissipation from the heat sink or second body 16, to thereby quickly cool the load is placed on the first body 14.

Additionally, the heated air drawn from the heat sink or second body 16 by the cooling fan 106 may optionally be used to warm an enclosed area 107 to simultaneously maintain a load cool as described above and maintain a second load 109 on or near the enclosed area warm. For example, the heated air may be circulated to an enclosed area 107 upon which butter or the like may be placed to maintain the butter soft and spreadable. Additionally or alternatively, the heated air from the heat sink or second body 16 may be circulated to a rack 15 external to the housing 12 to prevent condensation from forming upon objects placed on the rack 15 such as hot, fresh bread.

While certain embodiments of the present invention have been shown and described it is to be understood that the present invention is subject to many modifications and changes without departing from the spirit and scope of the claims presented herein.

I claim:

1. A thermoelectric cooling system comprising:

a housing;

a thermoelectric module comprising at least one heat sink and at least one heat source, said heat source comprising a load and a first body spaced from said load such that the first body is insulated from direct thermal association with the load;

an interface intermediate the first body and the heat sink such that the first body, the interface, and the heat sink are mechanically connected in series, the first body absorbing heat from the air surrounding said load and the heat being transferred through the interface to the heat sink by the Peltier effect when direct current is applied to the interface; and a control assembly comprising a thermocouple generating voltage in proportion to the temperature of the first body and a relay, the control assembly and the thermoelectric module electrically connected to each other in series, the relay sensing the voltage from the thermocouple and providing at least a first voltage level to the interface to cool the load when a first thermocouple voltage is sensed and a second voltage level to the interface sufficient to substantially prevent reversal of the heat source and the heat sink when a second thermocouple voltage is sensed.

2. The thermoelectric cooling system of claim 1, further comprising a fan directing heated air from said heat sink to an enclosed area.

3. The thermoelectric cooling system of claim 1, further comprising:

a rack external to said housing; and a fan directing heated air from said heat sink to said rack.

4. The device of claim 1 further comprising a moisture control pad in thermal contact with the first body or the interface, said moisture control pad absorbing condensation.

5. The device of claim 4 wherein said moisture control pad is intermediate the interface and the first body such that the first body, moisture control pad, interface, and heat sink are mechanically connected in series.

6. The device of claim 4 wherein said moisture control pad is a sheet of pulp fiber paper.

7. The device of claim 4 wherein said moisture control pad is exposed to ambient air such that the moisture control pad absorbs moisture from the ambient air and re-evaporates the absorbed moisture into the housing.

8. The device of claim 1 further comprising a thermally conductive metal strap intermediate the interface and the first body such that the first body, metal strap, interface, and interface are mechanically connected in series, the area of contact between the metal strap and the first body being substantially smaller than the total surface area of the first body.

9. The device of claim 1 further comprising a rack disposed intermediate said load and said first body to insulate said load from direct thermal association with said first body.

* * * * *